(12) United States Patent
Hierlemann et al.

(10) Patent No.: US 7,863,130 B2
(45) Date of Patent: Jan. 4, 2011

(54) TUNABLE STRESSED POLYCRYSTALLINE SILICON ON DIELECTRICS IN AN INTEGRATED CIRCUIT

(75) Inventors: Matthias Hierlemann, Fishkill, NY (US); Chandrasekhar Sarma, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 492 days.

(21) Appl. No.: 11/803,836

(22) Filed: May 16, 2007

(65) Prior Publication Data

US 2008/0283927 A1 Nov. 20, 2008

(51) Int. Cl.
*H01L 21/8242* (2006.01)
(52) U.S. Cl. .................. 438/248; 257/301; 257/310; 438/243; 438/244; 438/245; 438/246; 438/247; 438/386; 438/387; 438/388; 438/389; 438/390
(58) Field of Classification Search ......... 257/295–310; 438/243–249, 386–392, FOR. 212
See application file for complete search history.

(56) References Cited

U.S. PATENT DOCUMENTS

| | | | | |
|---|---|---|---|---|
| 4,925,805 A | * | 5/1990 | van Ommen et al. | 438/407 |
| 6,331,459 B1 | * | 12/2001 | Gruening | 438/243 |
| 2004/0229424 A1 | * | 11/2004 | Fischer et al. | 438/232 |
| 2004/0262695 A1 | * | 12/2004 | Steegan et al. | 257/371 |
| 2006/0046428 A1 | * | 3/2006 | Baiocco et al. | 438/425 |

OTHER PUBLICATIONS

Van Zutphen, A.J.M.M., et al., "Structure of thin polycrystalline silicon films on ceramic substrates," Journal of Crystal Growth 223, 2001, N.H. Elsevier, pp. 332-340.

* cited by examiner

*Primary Examiner*—Cuong Q Nguyen
*Assistant Examiner*—Meiya Li
(74) *Attorney, Agent, or Firm*—Slater & Matsil, L.L.P.

(57) ABSTRACT

System and method for creating stressed polycrystalline silicon in an integrated circuit. A preferred embodiment includes manufacturing an integrated circuit, including forming a trench in an integrated circuit substrate, forming a cavity within the integrated circuit substrate, wherein the cavity is linked to the trench, depositing a dielectric layer within the cavity, and depositing polycrystalline silicon over the dielectric layer, wherein an inherent stress is induced in the polycrystalline silicon that grows on the dielectric layer. The dielectric layer may be, for example, silicon aluminum oxynitride (SiAlON), mullite ($3Al_2O_3 \cdot 2SiO_2$), and alumina ($Al_2O_3$).

18 Claims, 5 Drawing Sheets

TUNABLE STRESSED POLYCRYSTALLINE SILICON ON DIELECTRICS IN AN INTEGRATED CIRCUIT

TECHNICAL FIELD

The present invention relates generally to a system and method for creating stressed polycrystalline silicon in an integrated circuit and, more particularly, to a system and method for adding dielectric layers to an integrate circuit to cause the polycrystalline silicon to grow with an inherent stress.

BACKGROUND

Generally, it is known that stresses induced on a transistor are important for boosting device performance. An n-channel metal oxide semiconductor field effect transistor (nMOSFET) will benefit from compressive stresses due to increases in electron mobility. A p-channel Metal Oxide Semiconductor Field Effect Transistor (pMOSFET) will benefit from tensile stresses due to increases in hole mobility. The type of substrate on which the poly is grown influences the stresses created in the poly films. Polycrystalline silicon (Poly) deposited on SiAlON (silicon aluminum oxynitride), for example, exhibits tensile stress. Poly deposited on mullite ($3Al_2O_3.2SiO_2$) or alumina ($Al_2O_3$), for example, exhibits compressive stress. Stress is generally larger at lower deposition temperatures due to smaller grain size and less columnar growth.

SUMMARY OF THE INVENTION

These and other problems are generally solved or circumvented, and technical advantages are generally achieved, by preferred embodiments of the present invention in which polycrystalline silicon is grown in an integrated circuit with an inherent stress thereby inducing stress in the transistor channel to increase mobility. The polycrystalline silicon can be grown on a dielectric layer that will create stress in the polycrystalline silicon. The stress of the polycrystalline silicon causes stress in the transistor device. For example, increased tensile stress is beneficial to electron mobility in an n-channel MOSFET transistor, and increased compressive stress is beneficial to hole mobility in a p-channel MOSFET transistor.

By growing the polycrystalline silicon on a dielectric layer in a cavity inside the integrated circuit substrate or within a gate structure, stress is induced in the surrounding area of the integrated circuit. The dielectric causes the polycrystalline silicon to grow in a manner that induces stress. By locating the stressed polycrystalline silicon near a transistor channel, the mobility of the device is increased and the MOS device performance will be improved. The stress in the polycrystalline silicon can be tweaked by varying the deposition temperature.

In accordance with a preferred embodiment of the present invention, a method for manufacturing an integrated circuit, comprises forming a trench in an integrated circuit substrate, forming a cavity within the integrated circuit substrate, wherein the cavity is linked to the trench, depositing a dielectric layer within the cavity, and depositing polycrystalline silicon over the dielectric layer, wherein an inherent stress is induced in the polycrystalline silicon that grows on the dielectric layer. The dielectric layer may be, for example, silicon aluminum oxynitride (SiAlON), mullite ($3Al_2O_3.2SiO_2$), and alumina ($Al_2O_3$).

When the dielectric layer is mullite ($3Al_2O_3.2SiO_2$) or alumina ($Al_2O_3$), then a compressive stress is created in the polycrystalline silicon grown on the dielectric. When the dielectric is a silicon aluminum oxynitride (SiAlON), then wherein a tensile stress is created in the polycrystalline silicon grown on the dielectric. The polycrystalline silicon may be removed from the trench, and the trench filled with an oxide.

In accordance with another preferred embodiment of the present invention, a method of manufacturing an integrated circuit device, comprises etching a channel in a gate of the integrated circuit, depositing a layer of dielectric material within the channel, and depositing polycrystalline silicon over the dielectric material layer within the channel, wherein an inherent stress is induced in the polycrystalline silicon that grows on the dielectric layer. In one embodiment, the integrated circuit is an n-channel MOSFET transistor, and the dielectric is mullite ($3Al_2O_3.2SiO_2$) or alumina ($Al_2O_3$). The polycrystalline silicon grown on the mullite or alumina dielectric has a compressive stress, which induces a tensile stress in a channel of the transistor. In another embodiment, the integrated circuit is a p-channel MOSFET transistor, and the dielectric is silicon aluminum oxynitride (SiAlON). The polycrystalline silicon on the silicon aluminum oxynitride has a tensile stress, which induces a compressive stress in a channel of the transistor.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
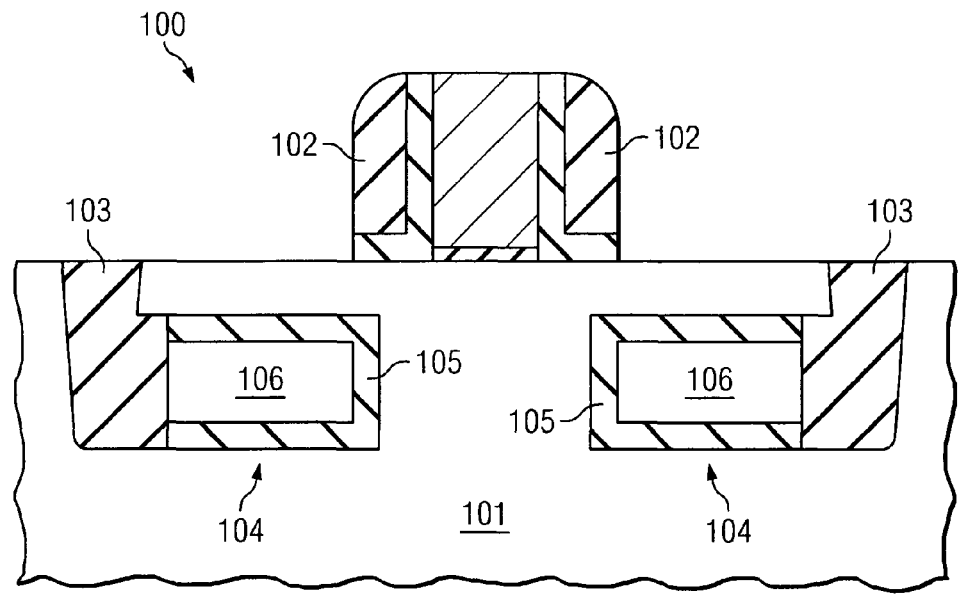
FIG. 1 is a block diagram of a integrated circuit device incorporating one embodiment of the invention.

FIG. 1 illustrates cross sections of transistor 100 having silicon substrate 101 and gate 102. Trench 103 is formed in substrate 101 as is well-known in the art for shallow trench isolation (STI). Cavities 104 are formed in substrate 101 and are open to trench 103. Depending upon the type of stress desired (i.e. compressive or tensile), dielectric 105 is deposited in cavity 104, such as by chemical vapor deposition (CVD). In one embodiment, SiAlON is deposited to induce tensile stress. In an alternative embodiment, mullite or alumina is deposited to induce compressive stress. After dielectric 105 grows on silicon 101, poly 106 is then deposited on dielectric 105 in cavity 104.

Table 1 lists exemplary characteristics for various dielectrics at different deposition temperatures, including the preferred orientation, lattice parameter, and residual stress of the silicon layers deposited on the dielectric.

TABLE 1

| Dielectric Material | Deposition Temperature (° C.) | Preferential Orientation ($I_{220}/I_{111}$) | Lattice Parameter a (nm) | Residual Stress $\sigma_1 + \sigma_2$ (Mpa) |
|---|---|---|---|---|
| SiAlON | 900 | 13.1 | 0.54275 | 553 |
| SiAlON | 1000 | 1.80 | 0.54285 | 384 |
| SiAlON | 1100 | 0.85 | 0.54285 | 315 |
| $Al_2O_3$ | 1100 | 0.20 | 0.54432 | −1790 |
| Mullite | 1100 | 0.42 | 0.54345 | −594 |

If dielectric 105 is SiAlON, then tensile stress will be created by ploy-si 106. The poly 106 will grow on dielectric 105 such that it will push out against the surrounding area, thereby causing stress in device 100. If dielectric 105 is mullite or alumina, then compressive stress will be created in device 100 by poly 106. In a preferred embodiment, ploy-si 106 is removed from isolation trench 103 and trench 103 is filled with oxide.

Figure 2:
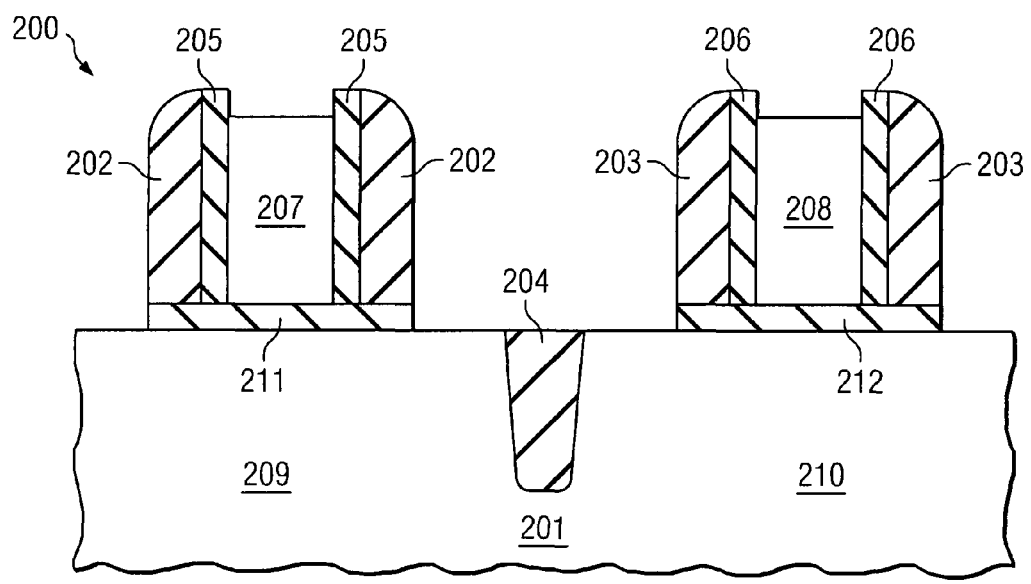
FIG. 2 is a block diagram of a integrated circuit device incorporating another embodiment of the invention.

FIG. 2 is a block diagram of transistor 200, which has silicon substrate 201, gates 202 and 203, and trench 204. In the embodiment illustrated in FIG. 2, stress is induced in device 200 by gates 202 and 203. Dielectric spacers are added to gates 202 and 203 in this embodiment, instead of using cavities in substrate 201 as discussed above with respect to FIG. 1. A channel or cavity is etched in gates 202 and 203. Dielectric 205 and 206 is deposited within the channel. Dielectric 205 and 206 may be the same material for both gates, or may be different materials for each gate. After the dielectric is deposited, then poly 207 and 208 is regrown in the channel on top of dielectric 205 and 206. The dielectric spacers 205 and 206 are formed of a material, such as SiAlON, alumina, or mullite, that causes poly 207 and 208 to grow with an inherent tensile or compressive stress. The type of inherent stress induced in the poly-si depends upon the type of material used for dielectric 205 and 206.

In one embodiment, gate 202 is part of an nMOSFET transistor 209, and gate 203 is part of a pMOSFET transistor 210. Dielectric 205 may be alumina or mullite, which causes poly 207 to grow with inherent compressive stress. As result, tensile stress is induced in nMOSFET channel 209. Dielectric 206 may be SiAlON, which causes poly 208 to grow with inherent tensile stress. As a result, compressive stress is induced in pMOSFET channel 210.

In yet another embodiment of the present invention, gate oxide layers 211 and 212 are constructed of materials that induce stresses on device 200. Gate oxide layers 211 and 212 may be grown on substrate 201 using materials with a high dielectric constant (high-K), such as aluminum compounds or oxynitrides. Oxide layers 211 and 212 are grown as a thin layer on substrate 201 using a material that induces stress in poly. Gates 202 and 203 are then grown on gate oxide layers 211 and 212, which cause the gate material to grow with an inherent stress. As a result, gates 202 and 203 induce stress into nMOSFET channel 209 and pMOSFET channel 210, respectively.

Figure 3A:
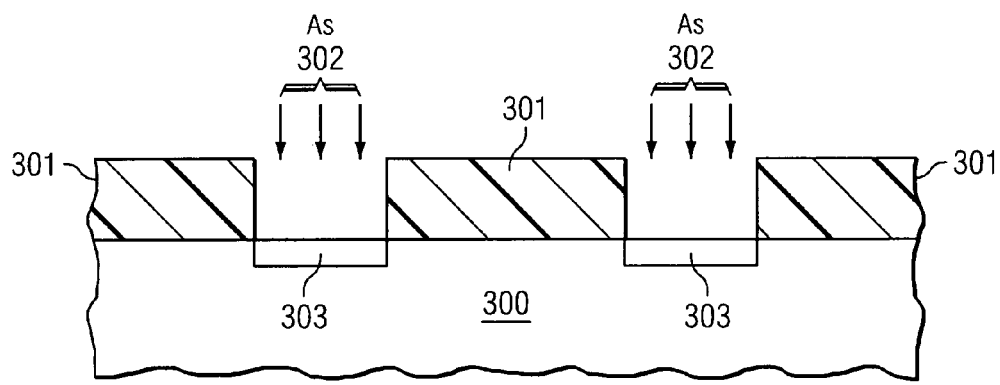
FIGS 3A-3E illustrate a process for incorporating embodiments of the invention into an integrated circuit.
Figure 3B:
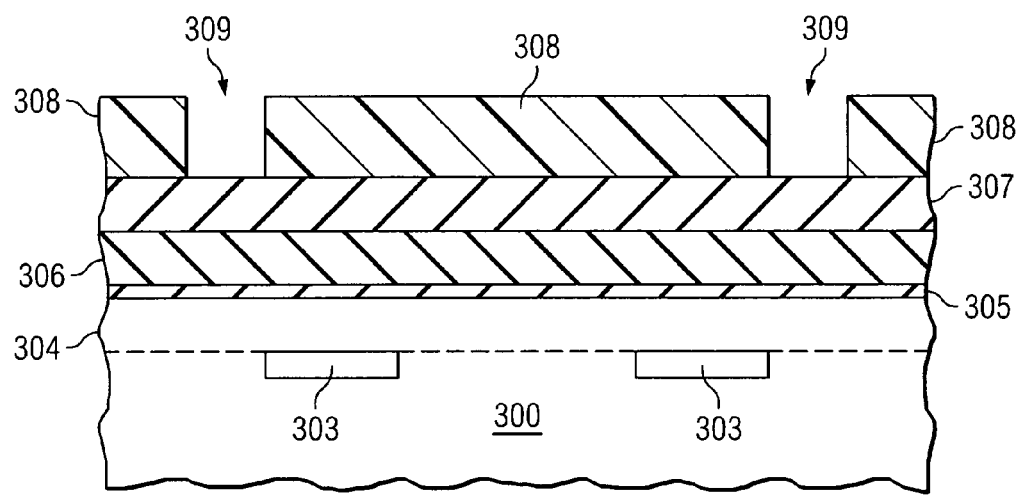

FIGS. 3A-3D illustrate a process for incorporating embodiments of the present invention into an integrated circuit. In FIG. 3A, photo resist 301 is applied to silicon substrate 300, which is then doped with Arsenic (As) 302 to create doped regions 303. After doping, photo resist 301 is striped from substrate 300. Referring to FIG. 3B, silicon layer 304 is deposited over doped regions 303 to bury the regions within the silicon substrate 300. Pad Oxide layer 305, Pad SiN layer 306, and TEOS layer 307 are deposited on over substrate 300. A second photo resist mask 308 is then applied over TEOS layer 307. The openings 309 in photo resist mask 308 are positioned to be slightly overlapping doped regions 303.

Figure 3C:
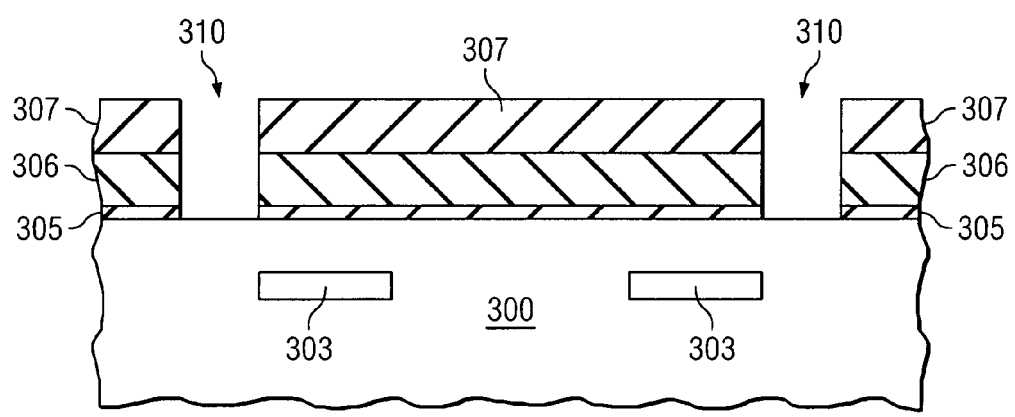
Figure 3D:
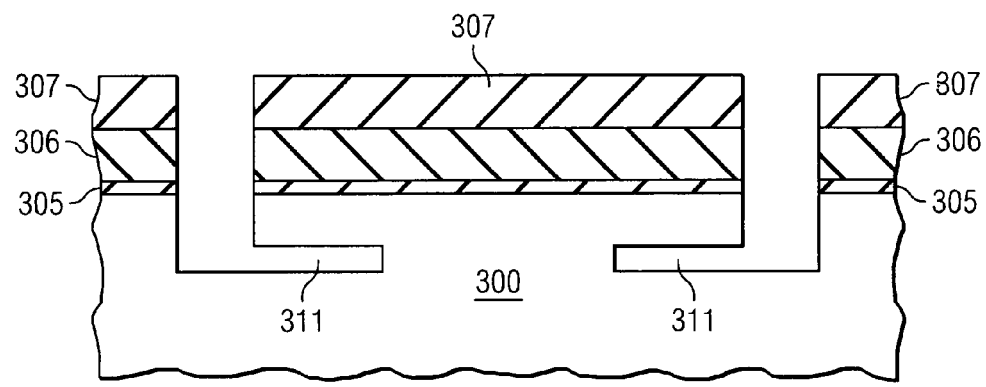
Figure 3E:
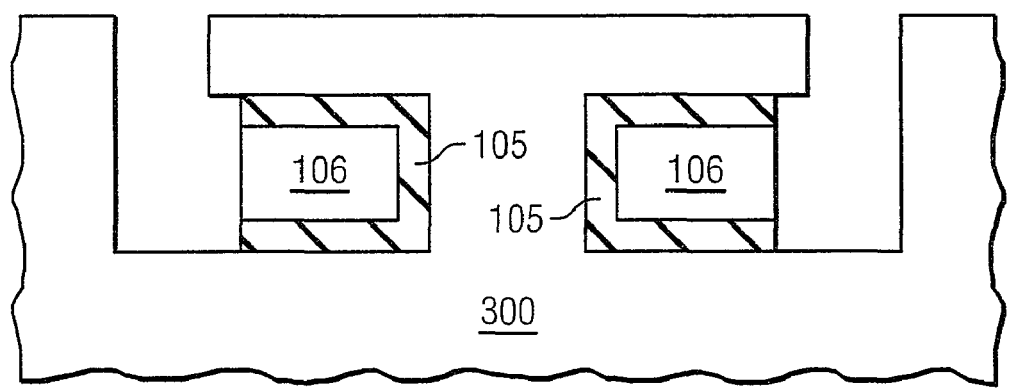

As shown in FIG. 3C, pad oxide layer 305, pad SIN layer 306, and TEOS layer 307 are etched away beneath photo resist openings 309 to create etched channels 310. Silicon substrate 300 is then etched beneath channels 310, as shown in FIG. 3D. When substrate 300 is etched down to doped regions 303, those regions are also etched away to form cavities 311. Once cavities 311 are formed, then a dielectric material (dielectric 105), such as mullite, alumina or SiAlON, can be deposited in cavities 311 as described above with respect to FIG. 1. As further described above, after the dielectric 105 has been deposited, poly 106 may be deposited on the dielectric 105, which will cause the poly 106 to grow with an inherent tensile or compressive stress. As illustrated in FIG. 3E, the poly 106 from the trench is removed. The trench is filled with an oxide as shown in FIG. 1. Using techniques that are known in the art, one or more of layers 305-307 may be further processed or stripped from the substrate or additional layers may be deposited to complete the integrated circuit.

Figure 4:
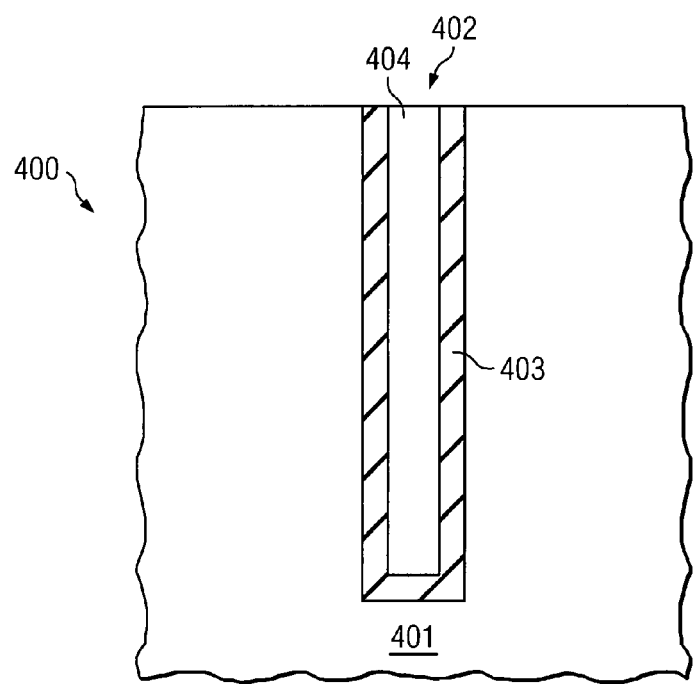
FIG. 4 is a diagram of another embodiment of the present invention using a deep trench to induce stress.

FIG. 4 illustrates another embodiment of the invention in which stress is applied in trenches in an integrated circuit substrate. This may be incorporated into, for example, trenches that are used in deep trench isolation or trench capacitors in DRAM. Device 400 may be part of a silicon wafer or a DRAM, for example. Stress may be introduced into substrate 401 to improve device performance and/or to counteract defects from the manufacturing process, such as wafer bending or warping. Narrow trench 402 is etched into substrate 401. In one embodiment, trench 402 may be 7 um deep and may have an aspect ration of up to 1:100. Dielectric layer 403 is deposited on the sidewall and/or bottom surfaces of trench 402. Poly 404 is then grown on dielectric 403. Depending upon the type of dielectric used, ploy 404 will grow with an inherent compressive or tensile stress, which is then imparted on the surrounding substrate 401.

Figure 5:
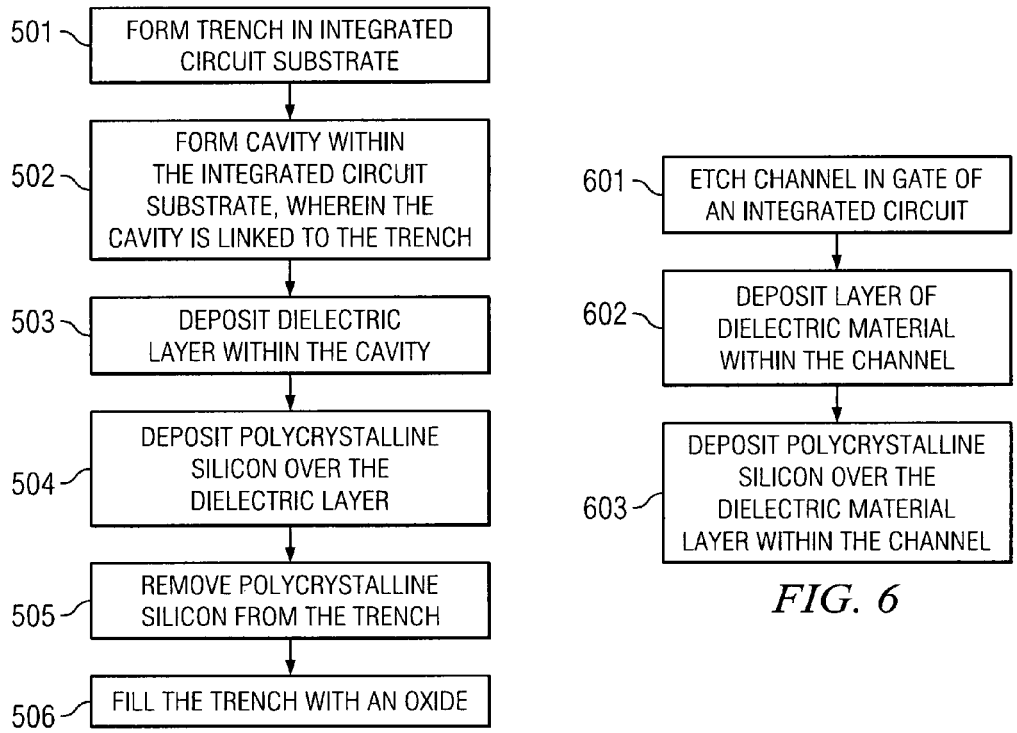
FIG. 5 is a flow chart for a process for implementing one embodiment of the present invention.

FIG. 5 is a flowchart of a process for implementing the embodiment illustrated in FIG. 1. A trench is formed in an integrated circuit substrate (501), and then a cavity is formed within the integrated circuit substrate (502), wherein the cavity is linked to the trench. A dielectric layer is deposited within the cavity (503), and a polycrystalline silicon is deposited over the dielectric layer (504). An inherent stress is induced in the polycrystalline silicon that grows on the dielectric layer. The dielectric layer is selected from the group consisting of SiAlON, mullite, and alumina. If the dielectric layer is mullite or alumina, a compressive stress is created in the polycrystalline silicon grown on the dielectric. If the dielectric is SiAlON, then a tensile stress is created in the polycrystalline silicon grown on the dielectric. In one embodiment, the polycrystalline silicon may be removed from the trench (505); and the trench filled in with an oxide (506).

Figure 6:
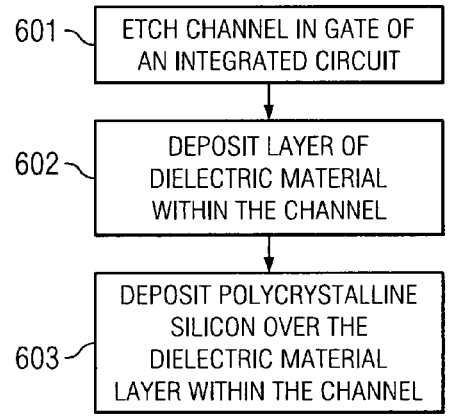
FIG. 6 is a flow chart for a process for implementing another embodiment of the present invention.

FIG. 6 is a flowchart of a process for implementing an embodiment of the invention illustrated in FIG. 2. A channel is etched in an integrated circuit gate structure (601). A layer of dielectric material is deposited within the channel (602), and a polycrystalline silicon is deposited over the dielectric material layer within the channel (603). An inherent stress is induced in the polycrystalline silicon. If the integrated circuit is an n-channel MOSFET transistor, the dielectric used may be mullite or alumina to create a compressive stress in the polycrystalline silicon, which induces a tensile stress in a channel of the transistor. If the integrated circuit is a p-channel MOSFET transistor, the dielectric used may be a SiAlON to create a tensile stress in the polycrystalline silicon, which induces a compressive stress in a channel of the transistor.

Figure 7:
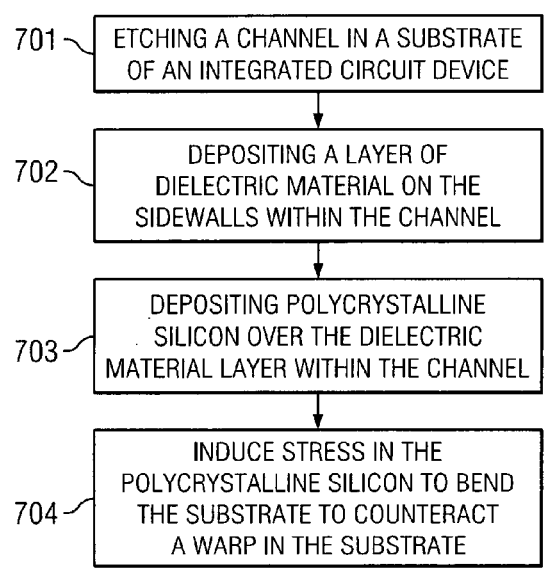
FIG. 7 is a flow chart for a process for implementing an additional embodiment of the invention.

FIG. 7 is a flowchart of a process for implementing an embodiment of the invention illustrated in FIG. 4. A channel is etched in a substrate of the integrated circuit device (701), and a layer of dielectric material is deposited on the sidewalls within the channel (702). Polycrystalline silicon is deposited over the dielectric material layer within the channel (703), and a stress is induced in the polycrystalline silicon by the dielectric material. In one embodiment, the stress induced in the polycrystalline silicon causes the substrate to bend to counteract a warp in the substrate (704).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing an integrated circuit, comprising:
   forming a first trench and a second trench in a substrate;
   forming a first cavity and a second cavity within the substrate, wherein the first cavity is linked to the first trench at a first sidewall, wherein an opposite second sidewall of the first trench is not linked to any other cavity, wherein the second cavity is linked to the second trench at a first sidewall, and wherein an opposite second sidewall of the second trench is not linked to any other cavity;
   depositing a dielectric layer within the first cavity and the second cavity;
   depositing polycrystalline silicon over the dielectric layer within the first cavity and the second cavity, the polycrystalline silicon filling at least a part of the first trench and a part of the second trench, wherein an inherent stress is induced in the polycrystalline silicon that grows on the dielectric layer; and
   forming a gate over a portion of the substrate between the first cavity and the second cavity.

2. The method of claim 1, wherein the dielectric layer is selected from the group consisting of: silicon aluminum oxynitride (SiAlON), mullite ($3Al_2O_3 \cdot 2SiO_2$), and alumina ($Al_2O_3$).

3. The method of claim 1, wherein the dielectric layer is mullite ($3Al_2O_3 \cdot 2SiO_2$) or alumina ($Al_2O_3$); and wherein a compressive stress is created in the polycrystalline silicon grown on the dielectric layer.

4. The method of claim 1, wherein the dielectric layer is a silicon aluminum oxynitride (SiAlON); and wherein a tensile stress is created in the polycrystalline silicon grown on the dielectric layer.

5. The method of claim 1, further comprising:
   removing the polycrystalline silicon from the trench but not the cavity; and
   filling the trench with an oxide.

6. A method for manufacturing an integrated circuit, comprising:
   forming a first trench and a second trench in a substrate;
   forming a first cavity in the substrate, the first cavity having a first end and an opposite second end, wherein the first end of the first cavity is linked to the first trench to form a first L-shaped trench cavity structure;
   forming a second cavity having a third end and an opposite fourth end in the substrate, wherein the third end of the second cavity is linked to the second trench to form a second L-shaped trench cavity structure;
   forming a first dielectric layer on walls of the first cavity;
   depositing a first polycrystalline silicon in the first cavity on the first dielectric layer;
   forming a second dielectric layer on walls of the second cavity;
   depositing a second polycrystalline silicon in the second cavity on the second dielectric layer; and
   forming a gate over a region of the substrate disposed between the first and the second cavities.

7. The method of claim 6, wherein the first dielectric layer is selected from the group consisting of: silicon aluminum oxynitride (SiAlON), mullite ($3Al_2O_3 \cdot 2SiO_2$), and alumina ($Al_2O_3$).

8. The method of claim 6, wherein the first dielectric layer is mullite ($3Al_2O_3 \cdot 2SiO_2$) or alumina ($Al_2O_3$); and wherein a compressive stress is created in the first polycrystalline silicon grown on the first dielectric layer.

9. The method of claim 6, wherein the first dielectric layer is silicon aluminum oxynitride (SiAlON); and wherein a tensile stress is created in the polycrystalline silicon grown on the first dielectric layer.

10. The method of claim 6, further comprising an oxide filling the first trench and the second trench.

11. The method of claim 6, further comprising forming a first spacer disposed on a first sidewall of the gate, wherein at least a portion of the first cavity is disposed under the first spacer.

12. A method for manufacturing an integrated circuit, comprising:
   forming a doped region on a top surface of a substrate, the doped region having a first end and an opposite end along a lateral direction perpendicular to a surface normal to the top surface of the substrate;
   epitaxially growing a further layer on the top surface of the substrate;
   forming a trench oriented along a vertical direction parallel to the surface normal within the further layer and the substrate, a bottom portion of the trench contacting the doped region;
   laterally etching the doped region from the first end to the second end thereby forming a cavity oriented along the lateral direction, wherein the cavity is formed on a first sidewall of the trench and wherein no cavity is formed on an opposite second sidewall of the trench;

depositing a dielectric layer within the cavity; and depositing polycrystalline silicon over the dielectric layer, wherein an inherent stress is induced in the polycrystalline silicon that grows on the dielectric layer.

13. The method of claim 12, wherein the dielectric layer is selected from the group consisting of: silicon aluminum oxynitride (SiAlON), mullite ($3Al_2O_3 \cdot 2SiO_2$), and alumina ($Al_2O_3$).

14. The method of claim 12, wherein the dielectric layer is mullite ($3Al_2O_3 \cdot 2SiO_2$) or alumina ($Al_2O_3$); and wherein a compressive stress is created in the polycrystalline silicon grown on the dielectric layer.

15. The method of claim 12, wherein the dielectric layer is a silicon aluminum oxynitride (SiAlON); and wherein a tensile stress is created in the polycrystalline silicon grown on the dielectric layer.

16. The method of claim 12, further comprising filling the trench with an oxide.

17. The method of claim 11, further comprising forming a second spacer disposed on a second sidewall of the gate, wherein at least a portion of the second cavity is disposed under the second spacer.

18. The method of claim 12, wherein the etching selectively etches the doped region relative to the substrate.

* * * * *